United States Patent [19]
Mori et al.

[11] 4,329,776
[45] May 18, 1982

[54] COMPONENT INSERTING APPARATUS
[75] Inventors: Kazuhiro Mori; Hiroshi Nakagawa; Yoshihiko Misawa, all of Katano; Kiyoshi Mayahara, Kadoma, all of Japan
[73] Assignee: Matsushita Electric Industrial Co., Ltd., Osaka, Japan
[21] Appl. No.: 121,410
[22] Filed: Feb. 14, 1980
[30] Foreign Application Priority Data
Feb. 14, 1979 [JP] Japan ................................ 54-16611
[51] Int. Cl.³ ............................................. H05K 3/30
[52] U.S. Cl. ...................................... 29/741; 29/834
[58] Field of Search ...................... 29/741, 739, 564.1, 29/564.6, 564.7, 564.8, 834, 840
[56] References Cited
U.S. PATENT DOCUMENTS
4,051,593 10/1977 Mori et al. ......................... 29/564.6

Primary Examiner—Carl E. Hall
Attorney, Agent, or Firm—Wenderoth, Lind & Ponack

[57] ABSTRACT

A component inserting apparatus for inserting electrical and electronic components into printed circuit boards includes a chuck element for gripping a body portion of a component having a plurality of lead wires extending outwardly therefrom in the same direction, an insertion guide member which contacts outer sides of each of the lead wires so as to regulate the lead wires to be positioned at predetermined positions, thereby to guide the lead wires into corresponding openings formed in the circuit board, a vertically movable guide shaft member for rotatably supporting the insertion guide member, and an insertion shaft member coupled with the chuck element so as to be movable in the same direction as the guide shaft member and also relatively with respect to the guide shaft member.

2 Claims, 30 Drawing Figures (A)  (B)  (C)  (D)  (E)

COMPONENT INSERTING APPARATUS

BACKGROUND OF THE INVENTION

The present invention generally relates to an assembling apparatus for electrical and electronic components or parts, and more particularly to a component inserting apparatus which is arranged to insert electric components or parts each having its lead wires extending in the same directions, for example, various electric components having different shapes such as ceramic capacitors, (e.g. those shown in FIGS. 1(A) and 1(B)), electrolytic capacitors (e.g. one shown in FIG. 1(C)), vertical resistors (e.g. one shown in FIG. 1(D)), transistors (e.g. one shown in FIG. 1(E)) or the like into predetermined openings formed in a printed circuit board up to the root portions of the lead wires.

As shown in FIG. 2 to FIG. 4, one conventional apparatus of the above described type comprises a gripping means 202 for gripping the body of an electric component 201, a vertically movable main shaft 203 having the gripping means mounted thereon, a pair of positioning cams 207 rotatably disposed around horizontal shafts 204 under the gripping means 202 and each having an insertion guide 206 with a guide groove 205 formed therein, a spring 208 for urging the insertion guide 206 in a direction along which the lower end of the insertion guide 206 is mutually narrowed, and an adjusting device 210 adapted to regulate the pivotal range of the insertion guide 206 by the spring 208 and mounted on a bearing 209. When the positioning cam 207 comes into contact against one portion of the main shaft 203 through the descent of the main shaft 203, the motion of the insertion guide 206 in a direction along which the distance between the lower ends of the insertion guides 206 is spread is regulated. The lead wires of an electric component 201 gripped by the gripping means 202 descending together with the main shaft 203 are adapted to be guided to the given positions of the printed circuit board 211 by the insertion guides 206. Therefore, upon descending of the bearing 209, the insertion guides 206 contact a given position of the printed circuit board 211. Then, the main shaft 203 descends to allow one portion of the main shaft 203 to come into contact against the positioning cams 207 thereby securing the insertion guides 206 (FIG. 2). Upon further descending of the main shaft 203, the lead wires of the electric component 201 are inserted into the given holes by the guide grooves 205. As some space is provided between the printed circuit board 211 and the electric component body, the inserting operation is completed. One portion of the main shaft 203 and the positioning cam do not contact against each other, with the result that the insertion guide becomes rotatable (FIG. 3) around the horizontal shaft 204. When the main shaft 203 and the bearing 209 rise, the insertion guides 206 come into contact against the body of the electric component 201 and are rotatable around the shafts 204, with the result that the insertion guides rise while rotating in the directions of arrows A (FIG. 4). When the lead wires of the electric component 201 are inserted up to the roots of the lead wires in this method, the body of the electric component 201 comes into contact against the insertion guides 206. As the insertion guides 206 rotate around the shafts 204, they come into contact against the printed circuit board 211 to prevent the electric component 201 from being inserted further.

SUMMARY OF THE INVENTION

Accordingly, an essential object of the present invention is to provide an apparatus for inserting lead wires of electric components or parts into predetermined openings of printed circuit boards up to the roots of the lead wires regardless of sizes of the electric component bodies.

Another object of the present invention is to provide a component inserting apparatus of the above described type wherein a guide unit is easily detachable from a head body.

A further object of the present invention is to provide a component inserting apparatus of the above described type which is simple in construction and accurate in functioning, and readily introduced into manufacturing processes of electrical and electronic equipment at low cost.

In accomplishing these and other objects, according to one preferred embodiment of the present invention, there is provided a component inserting apparatus for inserting electrical and electronic components into printed circuit boards which comprises a chuck element for gripping a body portion of each of the components having a plurality of lead wires extending outwardly therefrom in the same direction, insertion guide means which contacts outer sides of each of the lead wires so as to regulate the lead wires to be positioned at predetermined positions thereby to guide the lead wires into corresponding openings formed in the circuit board, a vertically movable guide shaft member for rotatably supporting the insertion guide means, and an insertion shaft member coupled with the chuck element so as to be movable in the same direction as that of the guide shaft member and also relatively with respect to the guide shaft member. The insertion guide means is provided with a follower portion contacting a cam formed in the insertion shaft member and rotating the insertion guide means in association with sliding movement of the insertion shaft member for spacing the insertion guide means from the printed circuit board in the course of insertion of the lead wires of the gripped component into the corresponding openings in the printed circuit board and also for rotating the insertion guide means in a direction to be spaced from the component.

By the arrangement according to the present invention as described above, there is provided a component inserting apparatus which is capable of inserting lead wires of electrical and electronic components into predetermined openings of printed circuit boards in an efficient manner regardless of the sizes of the component bodies, with substantial elimination of the disadvantages inherent in conventional apparatuses of this type.

BRIEF DESCRIPTION OF THE DRAWINGS

These and other objects, features, aspects and advantages of the present invention will become more apparent from the following detailed description of a preferred embodiment thereof, with reference to the accompanying drawings in which.

DETAILED DESCRIPTION OF THE INVENTION

Figure 1:
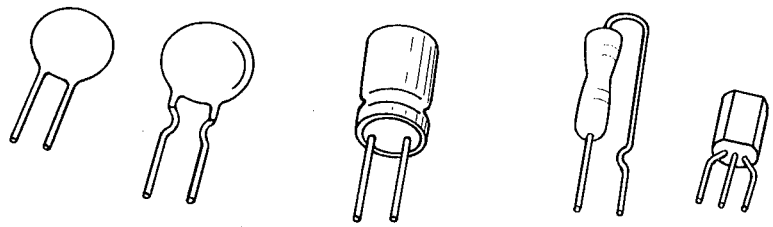
FIGS. 1(A), 1(B), 1(C), 1(D) and 1(E) are perspective views each showing an example of an electric component to be dealt with by an inserting apparatus in accordance with the present invention.
Figure 2:
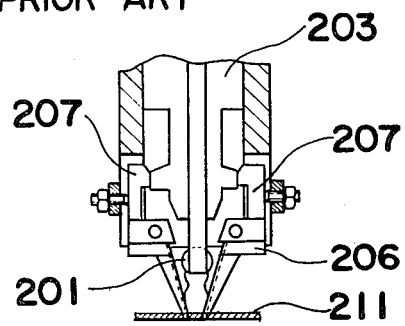
FIG. 2 is a fragmentary sectional view showing a main portion of a conventional component inserting apparatus in a state immediately before the component is to be inserted into a printed circuit board.
Figure 3:
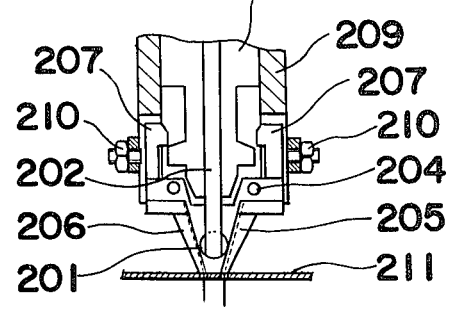
FIG. 3 is a view similar to FIG. 2, but shows a state where the component has been inserted into the printed circuit board.
Figure 4:
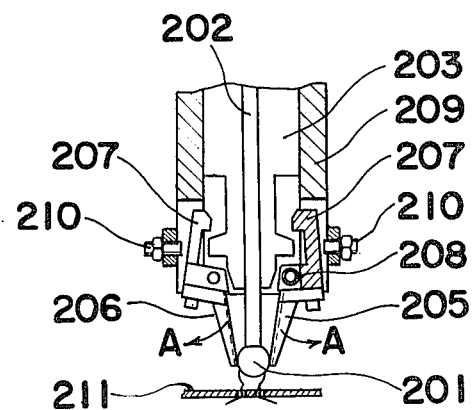
FIG. 4 is a view similar to FIG. 2, but shows a state where the component has been secured to the printed circuit board.

Before the description of the present invention proceeds, it is to be noted that like parts are designated by like reference numerals throughout the several views of the accompanying drawings.

Figure 5:
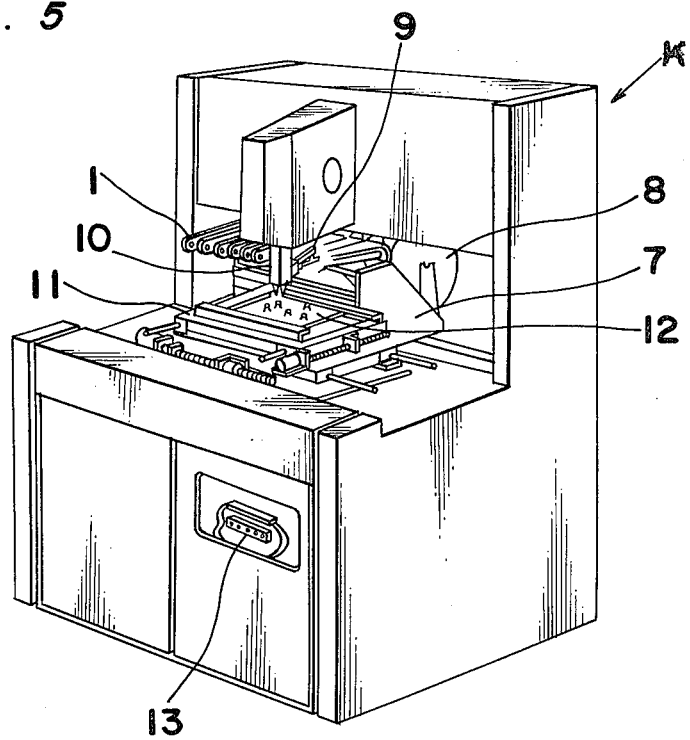
FIG. 5 is a perspective view of a component inserting apparatus according to one preferred embodiment of the present invention.

Referring now to the drawings, there is shown in FIG. 5 a component inserting apparatus K according to one preferred embodiment of the present invention.

The apparatus K generally includes a chuck element for gripping a body portion of each of the components having a plurality of lead wires extending outwardly therefrom in the same direction, insertion guide means which contacts outer sides of each of the lead wires so as to regulate the lead wires to be positioned at predetermined positions thereby to guide the lead wires into corresponding openings formed in the circuit board, a vertically movable guide shaft member for rotatably supporting the insertion guide means, and an insertion shaft member coupled with the chuck element so as to be movable in the same direction as that of the guide shaft member and also relatively with respect to the guide shaft member, which are described in detail hereinbelow.

Referring particularly to FIGS. 5 to 30, a belt-like component substrate 6 in which a plurality of electric components 3 each having lead wires 2a and 2b or 2a', 2b' and 2c extending in the same directions are secured at equal intervals, by an adhesive tape 5 on a flexible tape 4, for example, of paper or the like, is engaged with a tape transport unit 1 of a component inserting apparatus. The tape transport units 1 are detachably mounted on a unit moving table 7 together with component accommodating reel units 8 arranged in a plurality of rows, the component accommodating reel units being each disposed at the rear portion of the corresponding tape transport unit in a line. The unit moving table 7 moves from side to side to shift a desired tape transport unit 1 to a given component taking-out position of a component cutter and transfer unit 9 of the component inserting apparatus. The component cutter and transfer unit 9 cuts off the lead wires 2 of the components at the given component taking-out position to separate them from the tape 5, forms the lead wires to a given size and shape and grips the lead wires to carry them to an insertion head unit 10 of the component inserting apparatus. A substrate moving unit 11 of the component inserting apparatus retains a set printed circuit board 12 to move it longitudinally and laterally thereby to bring requisite portions of the circuit board 12 into line with the insertion head unit 10. A drive control unit 13 controls the inserting operations for the unit moving table 7, substrate moving unit 11 and insertion heat unit 10 in accordance with a predetermined program as shown within a flow chart of FIG. 30.

Firstly, the tape transport unit 1 will be described hereinafter.

Figure 6:
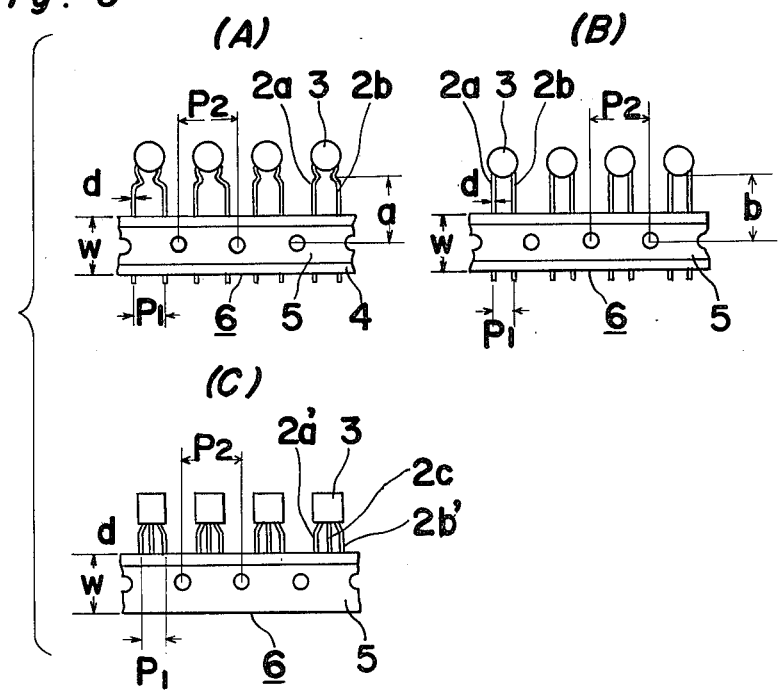
FIGS. 6(A) to 6(C) are fragmentary top plan views each showing an example of a belt-like component substrate.
Figure 7:
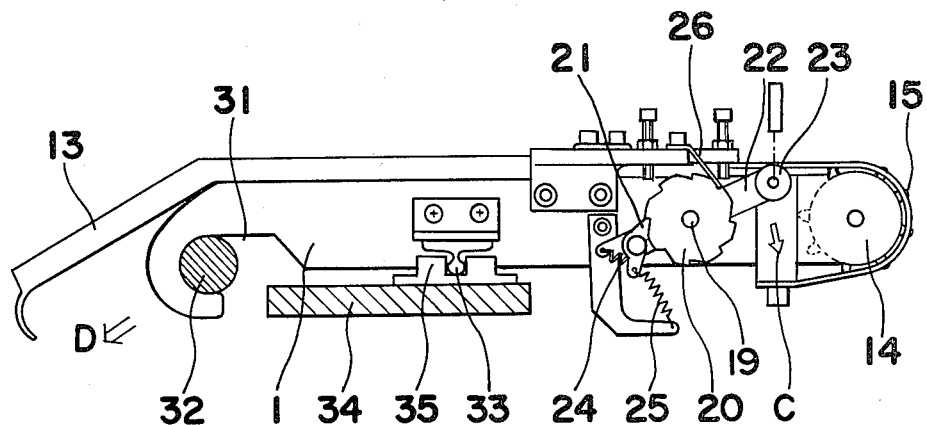
FIG. 7 is a front view of a tape transport unit partly in section, employed in the apparatus of FIG. 5.
Figure 8:
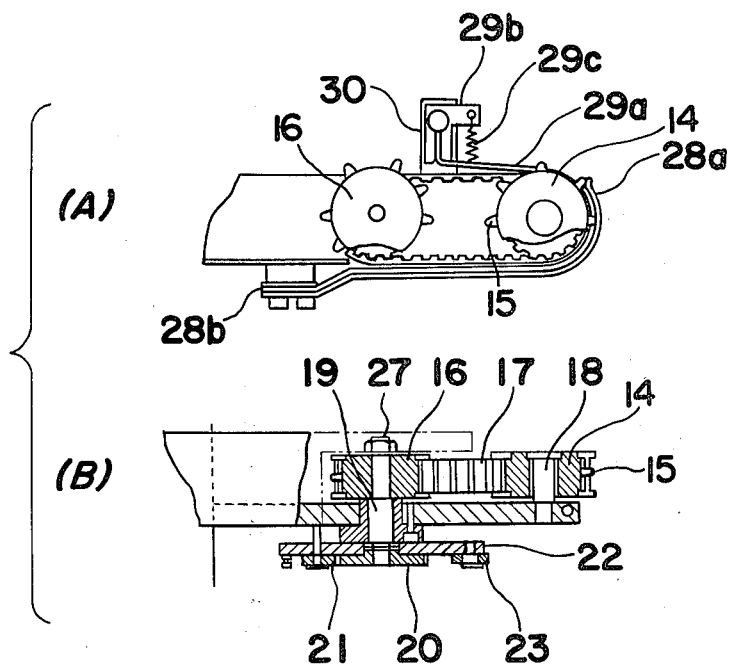
FIG. 8(A) is a fragmentary side elevational view of the tape transport unit of FIG. 7.
FIG. 8(B) is a top plan view, partly in section, of the tape transport unit of FIG. 7.

In the present embodiment, components 3 each having lead wires are arranged by a tape 5 at equal intervals P2, on a tape 4 of width W as shown in FIG. 6. The lead wire has a diameter d, with the distance between the pair of lead wires set to be a pitch P1.

A pair of transport ratchet wheels 14, 16 transports the taped components 3 toward a given component taking-out position. Tape transport studs 15 are arranged on the transport ratchet wheels 14, 16 at a pitch equal to the distance P2 in the component substrate 6. The transport ratchet wheel 14 and the transport ratchet wheel 16 are connected by a timing belt 17 and are pivotally supported, respectively, by a stationary shaft 18 and a rotatable shaft 19. A drive ratchet wheel 20 which is provided with the same number of pawls as that of the transport ratchet wheel 16 is mounted on the opposite side shaft end of the rotatable shaft 19 of the transport ratchet wheel 16. A lever 22 with a pawl 21 mounted rotatably thereon for causing advance of the ratchet wheel 20 is pivotally mounted on the rotatable shaft 19. A roller 23 for reducing the frictional resistance when the lever 22 has been depressed is mounted on the distal portion of the lever remote from the pawl 21, while a pawl depressing spring 24, a lever return spring 25 and a ratchet wheel check plate-spring 26 are provided on the pawl 21, lever 22 and wheel 20, respectively. A timing regulation nut 27 for the ratchet wheels 14 and 16 is provided to allow the taped components 3 to come to a predetermined feed line B—B (see FIG. 9) of the given component taking-out position. A press plate spring 28a is provided to prevent the tape from being floated to retain the tape at the external periphery of the ratchet wheel 14, with a mounting bracket 28b provided on the tape transport unit 1 for the press plate spring 28a. A flexible hold-down belt 29a which is made of material having a small co-efficient of sliding frictional resistance is disposed inside the press plate spring 28a to ensure the tape transport effected by the ratchet wheel 14. One end of the belt 29a is fixedly attached to the bracket 28b. A tension bracket 29b is attached to the other end of the hold-down belt 29a to pull the hold-down belt 29a with a spring 29c and a mounting bracket 30 being provided on the tape transport unit 1.

Upon rotating of lever 22 in the direction of arrow C to move one pawl of the ratchet 20 in a known manner, the ratchet wheel 14 shifts the taped component 3 by the taping pitch P2 to transport the components 3 one by one up to the predetermined feed line B—B.

The transport unit 1 has a downwardly hooked portion or notch 31 at its base portion. The hooked portion may releasably engage a shaft 32 provided on the component inserting apparatus, which is common to all transport units 1. Each transport unit 1 may be held in position by the engagement of a ball catch element 33 provided in the central base portion of the transport unit 1 and a retainer piece 35 provided on a support board 34 of the component inserting apparatus. After disengaging the ball catch element 33 from the retainer piece 35, the distal portion (right side) of the transport unit 1 is lifted to be moved in the direction of arrow D for easier removal of the unit 1.

Figure 9:
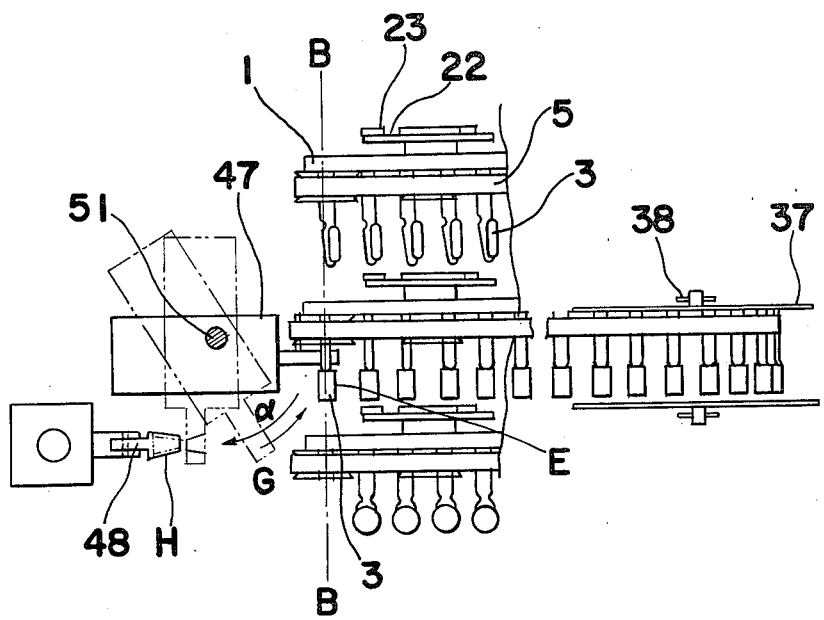
FIG. 9 is a top plan view showing essential portions from a tape transport unit for electric components each having two lead wires to a chuck element.
Figure 10:
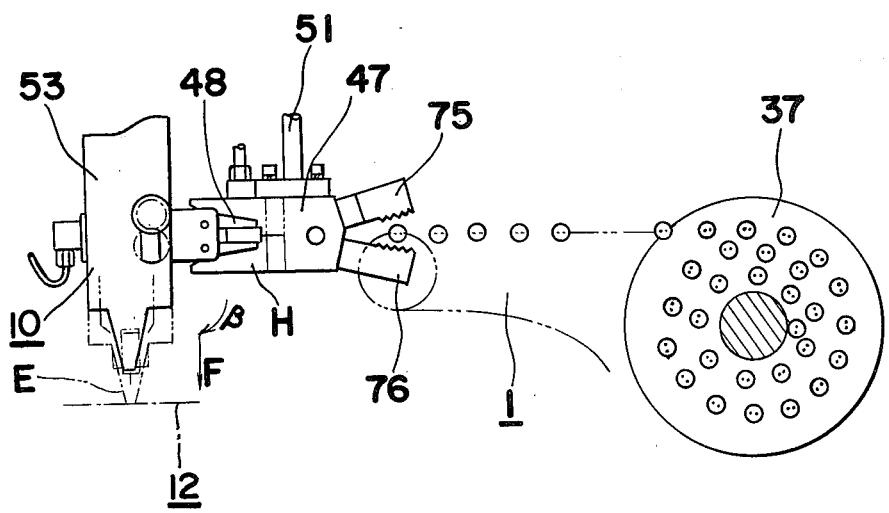
FIG. 10 is a side elevational view of the arrangement of FIG. 9.
Figure 11:
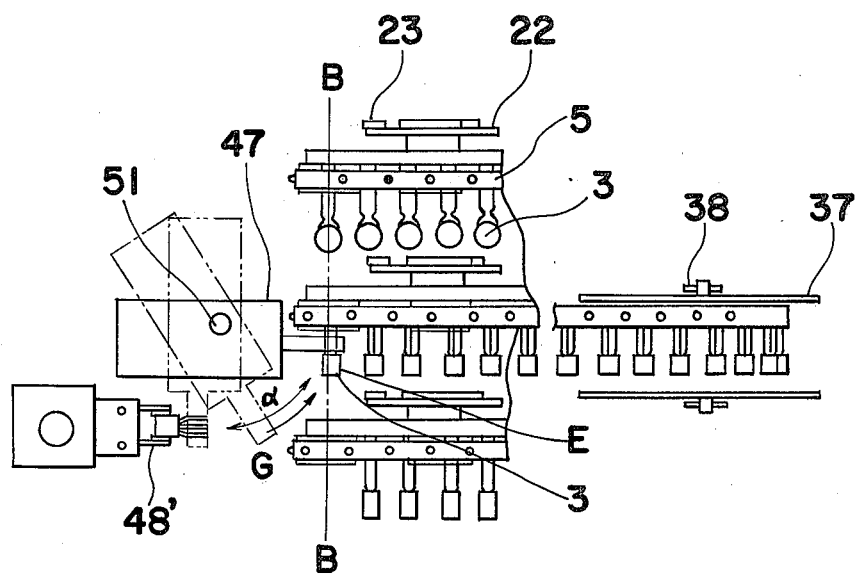
FIG. 11 is a top plan view showing essential portions to the chuck element from the tape transport unit for inserting electric components each having two or three lead wires extending therefrom.
Figure 12:
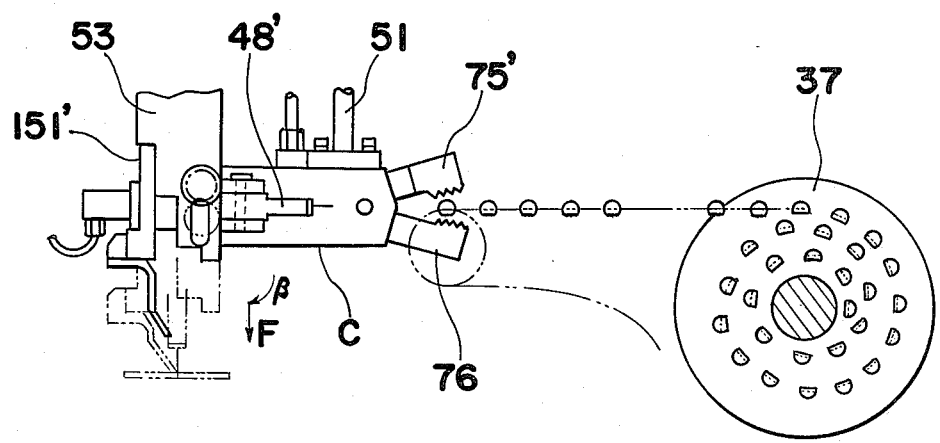
FIG. 12 is a side elevational view of the arrangement of FIG. 11.
Figure 13:
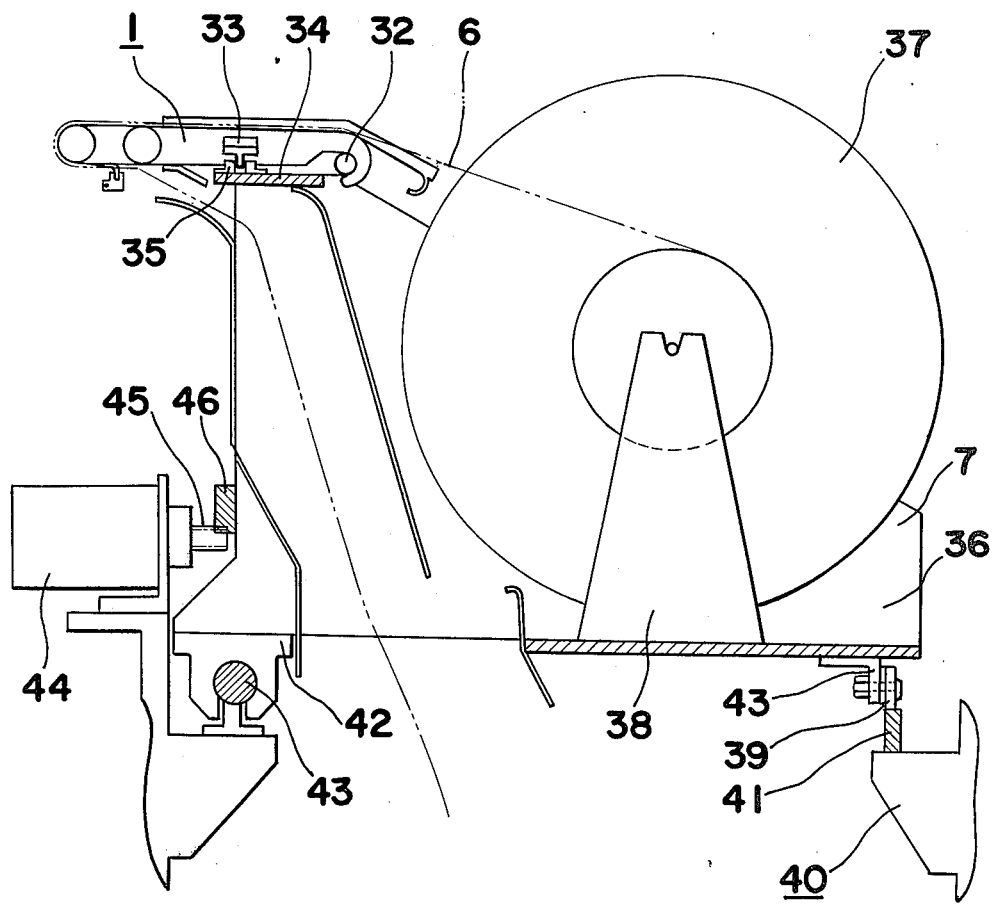
FIG. 13 is a cross-sectional view of a tape transport unit movable table employed in the apparatus of FIG. 5.
Figure 14:
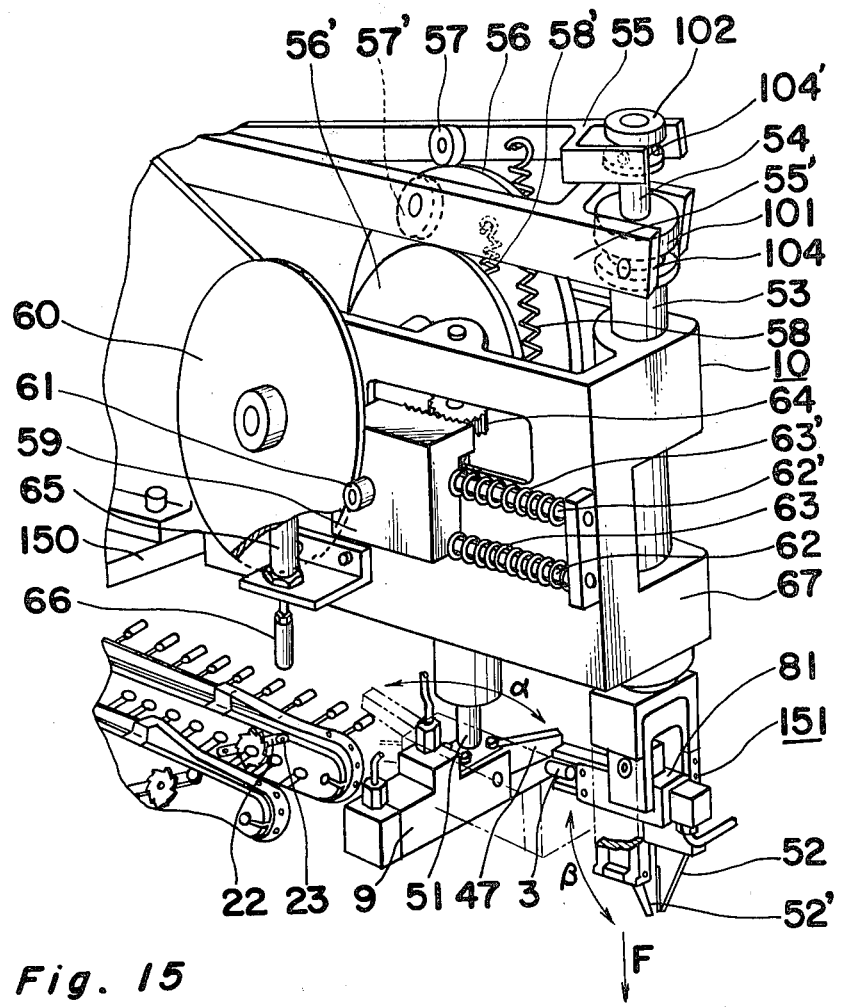
FIG. 14 is a perspective view showing essential portions of an insertion head unit for electric components each having two lead wires.
Figure 15:
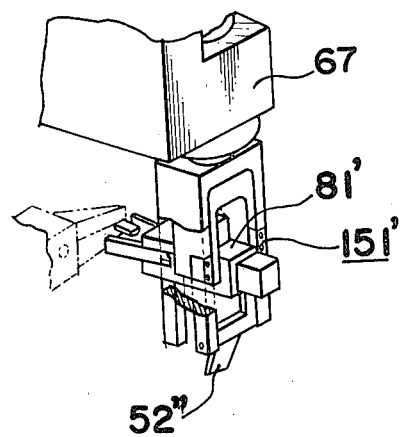
FIG. 15 is a fragmentary perspective view showing essential portions of the insertion head unit for electric components each having two or three lead wires.

Referring to FIG. 13 showing the tape transport unit moving table 7, a plurality of tape transport units 1 are engaged with a common tape transport unit retainer shaft 32, and in the above state, tape component accommodating reels 37 are pivotally supported on reel stands 38, corresponding in number to the tape transport units 1, provided on a movable base body 36 supporting at their upper ends the horizontal support board 34 for the units 1. A belt-like component substrate 6 is fed to the tape transport units 1 from each of respective corresponding reels 37. Also, one end of the movable base body 36 is supported, at its under face, by a rail 41 provided, in parallel relation to the retainer shaft 32 and the support board 34, on the component inserting apparatus frame 40 through a plurality of rollers 39, and another end of body 36 is supported by a guide rail 43 through a slide bearing 42. A pulse motor 44 is provided to drive the tape transport unit moving table 7 along the rails 41, 43. A pinion 45 and a rack 46 to be engaged with the pinion 45 are secured to the motor 44 and the base body 36, respectively. The tape transport units 1 selected through the rotational control of the drive pulse motor 44 are sequentially moved to the front of the insertion head unit 10. The components to be inserted are received one by one by a rotary cutter of the insertion head unit 10 from the taped state in the belt-like configuration to be inserted into predetermined positions in the substrate. A taped component which has been fed over the tape transport unit 1 to the position of feed line B—B of FIG. 9 or FIG. 11, is cut off at a cut-off position E by a cutter unit 47 of the insertion head unit 10 and, then, the cut-off component 3 is received and held by a chuck element 48 after clockwise rotation through an angle α in a horizontal plane, as shown in FIG. 9. After rotation through an angle β in a vertical plane as shown in FIG. 10, an insertion chuck unit body 81 FIG. 14 of the component inserting apparatus is lowered in the direction of the arrow F for insertion of the component into the predetermined position of the circuit board 12. A cutter shaft 51 of the component inserting apparatus is arranged to rotate the cutter unit 47, which is detachably mounted, by a bolt, on the cutter shaft 51, while insertion guides 52, 52′ or 52″ are provided on a guide shaft 53 which is slidably provided on the insertion head unit 10 as shown in FIG. 14. A drive arm 55 connects to an insertion shaft 54 which is provided with the chuck unit body 81 at its nose or distal end and is vertically moved through a cam roller 57 of the drive arm 55 by the rotation of a cam 56 provided on the component inserting apparatus, while guide shaft 53 is also vertically moved through a cam roller 57′ of a drive arm 55′ by the rotation of a cam 56′ effecting synchronous rotation with the cam 56, with tension springs 58 and 58′ being provided to urge the cam rollers toward the cams, respectively. A slide rack 59 rotates the cutter shaft 51 through a cam roller 61 by the rotation of a cam 60 provided on the component inserting apparatus. Slide shafts 62 and 62′ allow the slide rack 59 to slide thereon, and there are also provided return springs 63 and 63′ to urge the slide rack 59 toward the cam 60. A gear 64 is provided at the central portion of the cutter shaft 51 to engage the slide rack 59. The chuck body 81 rotatably supported at the distal end of the insertion shaft 54 and guide unit 151 located at the end of the guide shaft 53 are detachably mounted by bolts and are replaceable, respectively, by a chuck unit body 81' of another type and a guide unit 151' to be applied to another type of component as shown in FIG. 15.

A cylinder 65 is mounted on an insertion head body 67 so that a pusher 66 mounted at the nose or distal portion of the piston rod of the cylinder may push the lever 22 through the roller 23 of the tape transport unit 1 when the tape transport unit 1 is located at the cut-off position E. Meanwhile, the insertion head body 67 is mounted on a base 150 on the apparatus frame 40.

Figure 16:
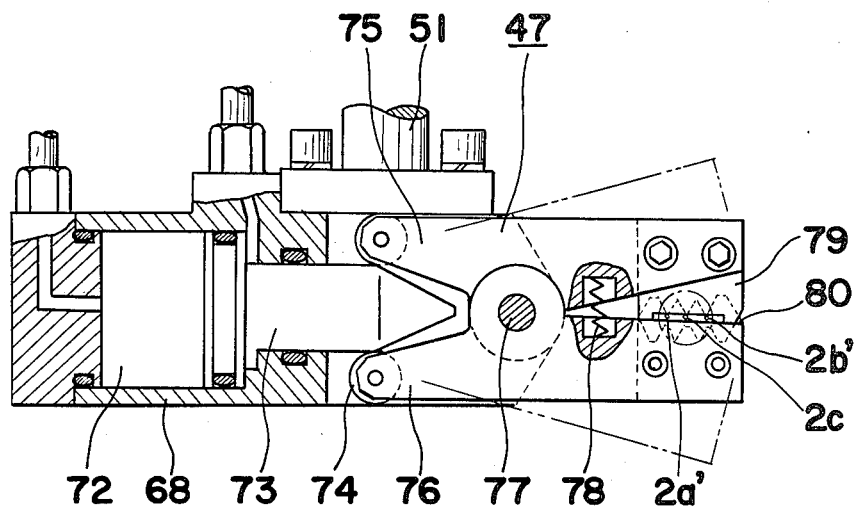
FIG. 16 is a cross-sectional view of a component cutter and transport unit employed in the apparatus of FIG. 5.
Figure 17:
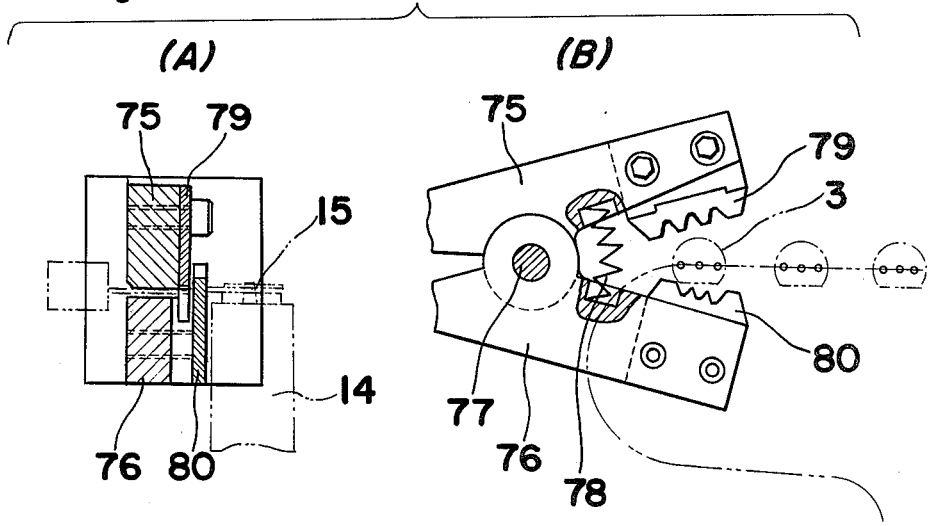
FIGS. 17(A) and 17(B) are a front side sectional view of the component cutter and transport unit and a detailed view of the cutter upper and lower jaws.
Figure 18:
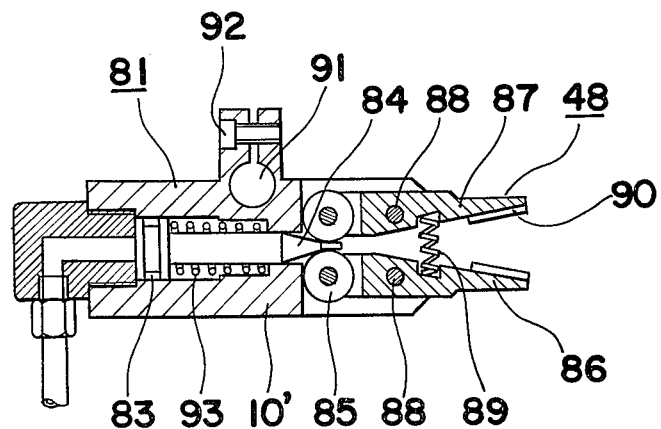
FIG. 18 is a side sectional view of a chuck element for clamping an electric component having two lead wires attached thereto.

Referring now to FIG. 16, a cutter unit body 68 of the cutter unit 47 constitutes a cylinder 72. A piston 73 which is conical at its forward end is incorporated in the cylinder 72, and the conical face of the piston comes into contact with the cutter unit 47 through a pair of rollers 74 during the stroke of a reciprocating operation to open or close the cutter unit 47. Upper lever 75 and lower lever 76 are pivotally supported by a pin 77 at the forward end of the cutter unit body 68, with the front ends of the levers normally urged to open by a compression spring 78. The forward ends of the upper lever 75 and the lower lever 76 are provided, respectively, with upper and lower jaws 79 and 80 each having a plurality of V-shaped grooves. Simultaneously with closing of the upper and lower levers 75 and 76, the end portions of the lead wires of a component are cut off from the tape 5 and the remaining lead wires are held thereby. The upper and lower jaws 79 and 80 are provided, in configuration, with three V-shaped grooves respectively. When the upper and lower levers 75 and 76 are closed, the respective V-shaped grooves come into alignment at their bottoms. The pitch of the end grooves among the three V-shaped grooves of the upper and lower jaws 79 and 80 is adapted to be the distance between two lead wires of the component, the remaining V-groove being located at a position one half of the pitch. The distance between the ends $2a'$ and $2b'$ of the three lead wires $2a'$, $2b'$ and $2c$ of a transistor or the like is approximately the same in dimension as the distance between the two lead wires of an electrolytic capacitor, a magnetic capacitor, or the like. At the cut-off position E, the lead wires of a component 3 which has been fed to the feed line B—B are adapted to come to the ends of the V-shaped grooves. An electric component with two lead wires $2a$ and $2b$ attached thereto such as magnetic capacitor or the like, is gripped by the ends of the V-shaped grooves and is cut off by further advance of the upper and lower jaws 79 and 80. Also, an electric component with three lead wires $2a'$, $2b'$ and $2c$, such as transistor or the like, is cut off by the three V-shaped grooves. On the assumption that the opening between the upper and lower levers 75 and 76 during the cut-off operation is slightly greater (1.5 d to 3 d) in value than the diameter d of the lead wire, the lead wires of the component 3 are gripped by the upper and lower levers 75 and 76 approximately simultaneously with the cut-off operation thereby to retain the component without rendering the component released. The upper and lower jaws 79 and 80 supported by shaft 51 are temporarily stopped, with the upper and lower levers 75 and 76 being open to release the component therefrom, in a position G which does not interfere with the motion of the tape transport unit 1 as shown in FIG. 9 or FIG. 11, and, then further, rotated upon application of insertion instructions from the drive control unit 13, thereby effecting the cutting, forming and retaining actions. Immediately after the rotation is effected through an angle $\alpha$, the component is transferred to the chunk 48 or 48' of the chuck unit body 81 or 81' standing-by at a position H. Once the component is retained by the chuck 48, the upper and lower levers 75 and 76 being open return the upper and lower jaws 79 and 80 to the original position through the position The chuck element for inserting the electric component with two lead wires attached thereto will be described in detail with reference to FIG. 18.

Figure 19:
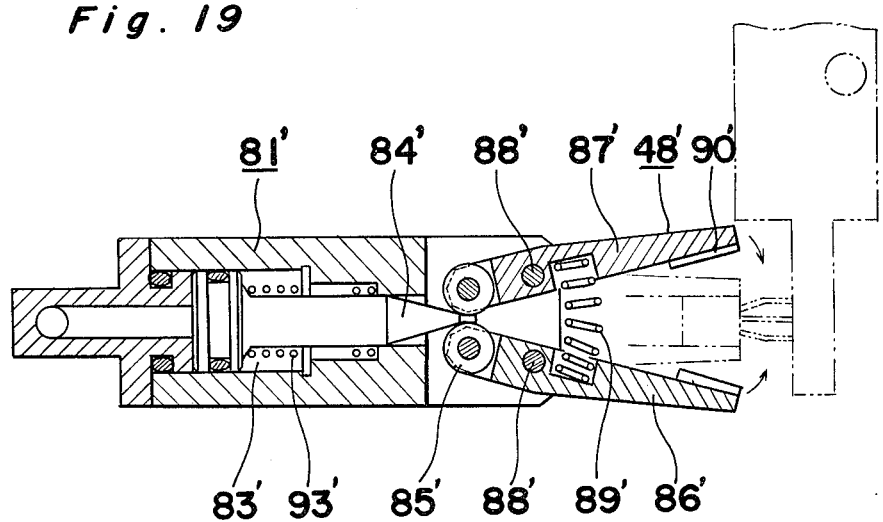
FIG. 19 is a top plan view in section of a chuck element for clamping an electric component having three lead wires attached thereto.

A chuck unit body 81 is provided with a cylinder 83. A piston 84 having a conical nose is incorporated inside the cylinder 83. A pair of gripping levers 86 and 87 come into contact with the conical face of the piston through rollers 85 for opening or closing operations thereof. The gripping levers 86 and 87 are pivotally mounted on pins 88 fixed to the chuck unit body 81. An expansion spring 89 normally keeps the lever forward portions open. Also, the noses of the gripping levers 86 and 87 are provided, respectively, with resilient bodies 90 each being made of rubber or the like to positively grip components which are different in thickness. A mounting hole 91 for the insertion shaft 54 is provided on the chuck unit body 81, and a tightening screw 92 is adapted to adjust the size of the hole 91. A return spring 93 for the piston 84 is provided within the cylinder 83. A chuck element for inserting the electric components with three lead wires attached thereto, such as transistor or the like, is shown in FIG. 19. A chuck unit body 81' is provided with a cylinder 83'. A piston 84' having a conical nose is incorporated inside the chuck unit body. A pair of gripping levers 86' and 87' come into contact against the conical face of the piston through rollers 85' for opening or closing operations. The gripping levers 86' and 87' are pivotally mounted on pins 88' fixed to the chuck unit body 81'. An expansion spring 89' normally keeps the lever forward portions open. Also, the noses of the gripping levers 86' and 87' are provided, respectively, with resilient bodies 90' each being made of rubber or the like to positively grip components which are different in thickness. The difference between the chuck unit bodies 81 and 81' will be described hereinafter. The gripping levers 86 and 87 of the chuck element 48 for inserting the electric components with two lead wires attached thereto are adapted to grip in a direction normal with respect to the space face provided by the two lead wires of the electric component. On the other hand, the gripping levers 86' and 87' of the chuck element 48' for the chuck unit body 81' for the electric components with three lead wires attached thereto are adapted to grip in a direction normal with respect to the gripping direction of the gripping levers 86 and 87 of the chuck element 48 for the chuck unit body 81.

Referring back again to FIG. 14, a guide shaft 53 forms an insertion head and is slidably movable for vertical motion in the insertion head body 67. An insertion shaft 54 is slidably movable for vertical motion through the guide shaft 53. An adjusting unit 101 is threadingly mounted on the top end of the guide shaft 53 and is adapted to vertically move the guide shaft 53 by the motion of the cam 56' through a pin 103 secured to the drive arm 55' and a roller 104 pivotally mounted on the pin 103 see FIG. 21. The guide shaft 53 is provided, at its lower end, with a guide unit 151 for supporting the chunk unit body 81 for an electric component with two lead wires attached thereto. The guide unit 151 has a pair of insertion guides 52, 52' each mounted through a pin 153 thereon, the insertion guides 52, 52' being disposed to face each other at a given diatance S corresponding to the conductor insertion pitch of the circuit printed board. For insertion of the electric component, with three lead wires attached thereto, and the electric component, with two lead wires attached thereto, in mixed relation, a guide unit 151' is mounted to the lower front end of the guide shaft 53. An insertion guide 52" having grooves for guiding the three lead wires is rotatably mounted by a support point pin 153' on the guide unit 151'.

Figure 21:
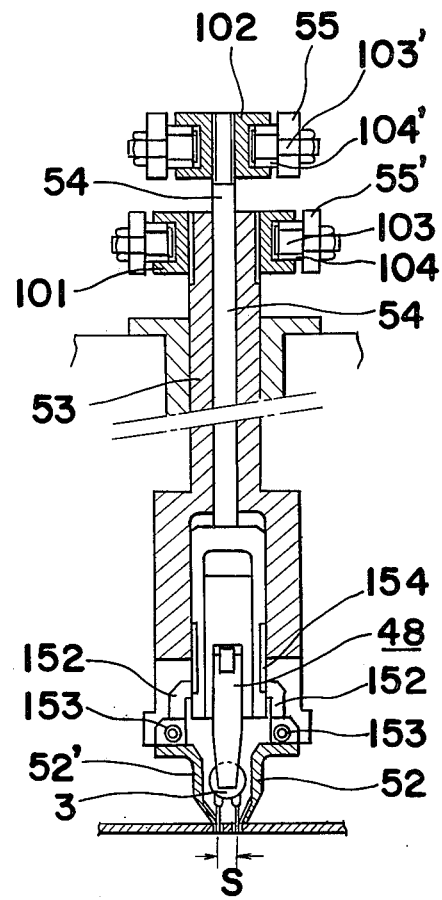
FIG. 21 is a front side sectional view of a head unit in a state where part of the lead wires have been inserted into the printed circuit board.
Figure 22:
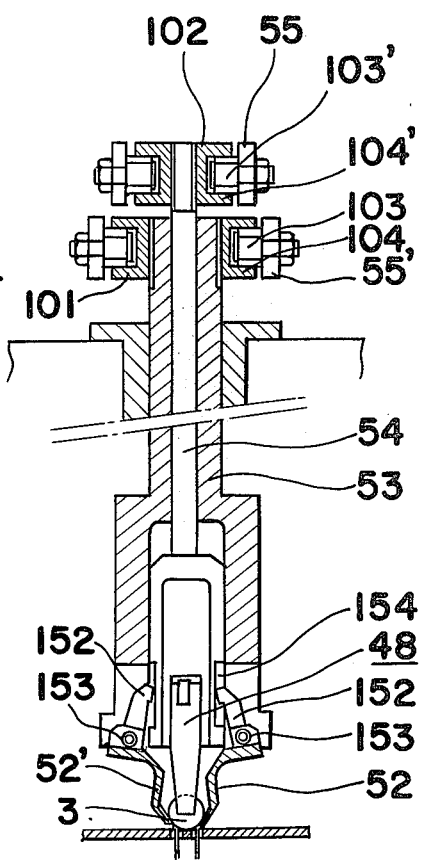
FIG. 22 is a front side sectional view of the head unit at the bottom dead center.

Referring now to FIGS. 21 and 22, an adjusting nut 102 is threadingly mounted on the top end of the insertion shaft 54 which is vertically moved by the motion of the cam 56 through a pin 103' secured to the drive arm 55 and a roller 104' rotatably mounted on the pin 103'.

The vertical oscillating motion imparted to the arms 55 and 55' by the cams 56 and 56' vertically slides the insertion shaft 54 and the guide shaft 53, respectively. The insertion shaft 54 and the guide shaft 53 start to descend from the top dead center of the cams 56 and 56', respectively. When the insertion guides 52, 52' or 52" have come into contact against the top face of the printed circuit board, the guide shaft 53 having the insertion guides 52, 52' or 52" is immediately stopped. The insertion shaft 54 further descends to insert the lead wires of the component into given holes of the printed circuit board 12 and to attach the component body onto the board 12. After completing the insertion of the lead wires, the insertion shaft 54 and the guide shaft 53 are raised up respectively by the cams 56 and 56'. If the bottom dead point for cam 56' which vertically operates the guide shaft 53 with the insertion guides 52, 52' or 52" at its lower end is set to be identical with a state such that the insertion guides 52, 52' or 52" may come to contact against the top face of the printed circuit board, the guide 52, 52' or 52" may be brought into the insertion hole without application of an external force upon the printed circuit board 12 to insert the lead wires of a component 3 thereinto. The nose elements of the insertion head unit 10 will be described hereinafter in detail. A pinion 106 (FIG. 20) with a shaft attached thereto is provided to rotate the chuck unit body 81 and a slide rack 108 engages the pinion 106. A sliding groove 109 is provided in the chuck unit body to slide the slide rack 108. A compression coil spring 111 is engaged inside the slide rack 108 to normally urge the slide rack 108 upwardly, so that the compression coil spring keeps the slide rack 108 in contact with the under face 112 of the head body 67 under the normal condition, as shown in FIG. 20.

Figure 20:
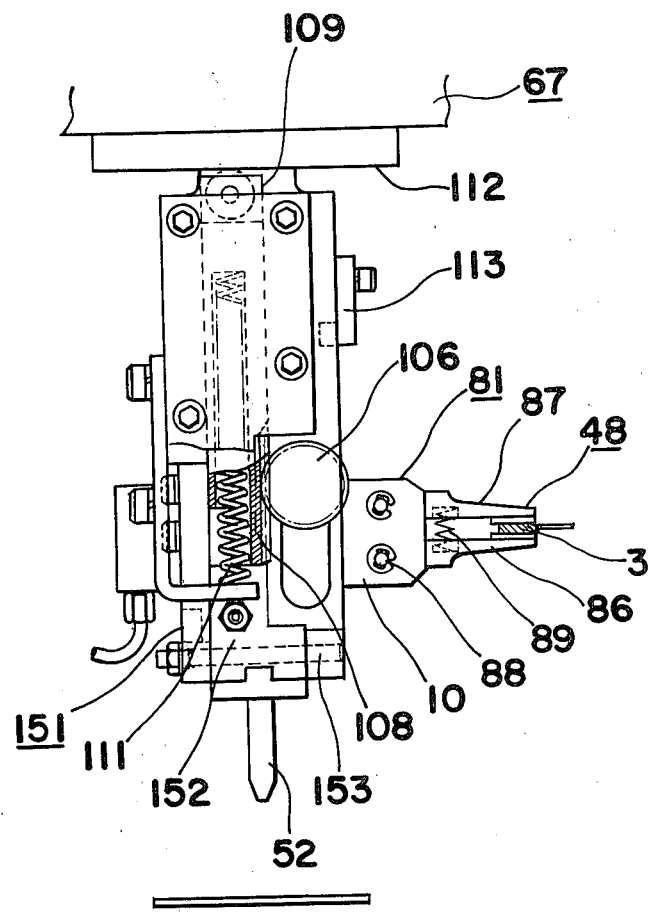
FIG. 20 is a side elevational view showing essential portions at a head unit top dead center with respect to an electric component with two lead wires attached thereto.
Figure 23:
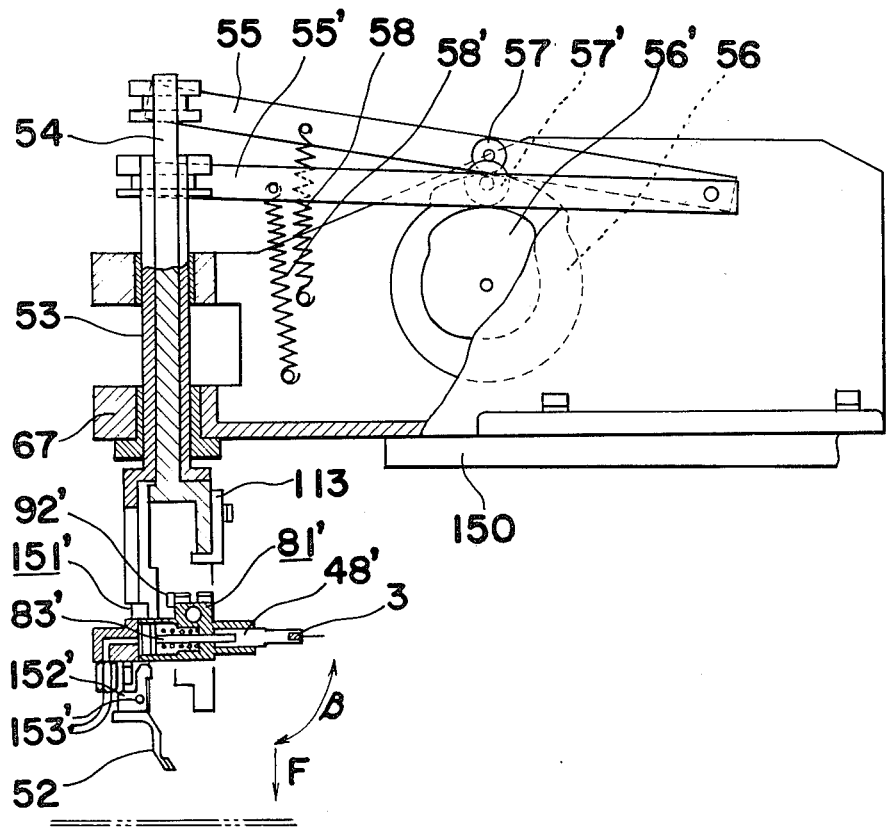
FIG. 23 is a side sectional view of the head unit, chuck element and guide unit during insertion of an electric component with three lead wires attached thereto.
Figure 24:
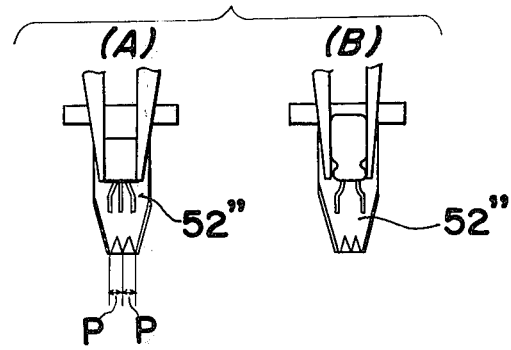
FIG. 24(A) is a fragmentary front side view of an insertion guide and a component during insertion of an electric component with three lead wires attached thereto.
FIG. 24(B) is a fragmentary front side view of the insertion guide and component during insertion of an electric component with two lead wires attached thereto.

Under the condition of FIG. 20, where the chuck unit body 81 is located horizontally at its top dead center, the slide rack 108 is kept in pressure contact against the under face of the insertion head body 67. The chuck unit body 81 or 81', as shown in FIG. 20 or 23, is fixedly mounted for horizontal positioning on the shaft of the pinion 106 engaging the slide rack 108, and the component 3 is transferred from the component cutter and transfer unit 9 to the chuck element 48 and commences for insertion of the lead wires by the head descending operation.

Figure 25:
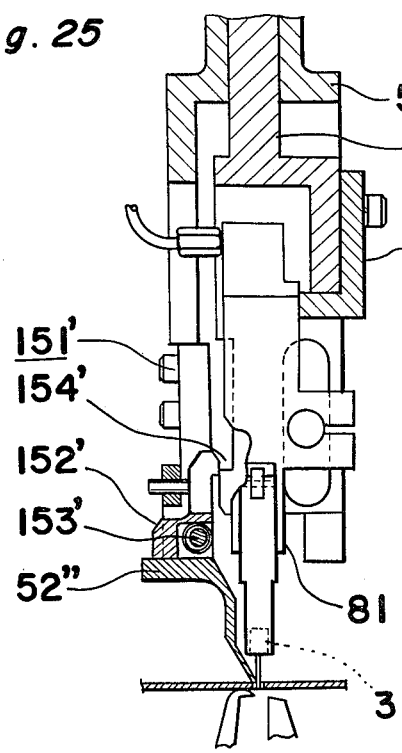
FIG. 25 is a sectional view of the head unit in a state where an electronic component with three lead wires attached thereto has been partially inserted into the printed circuit board.
Figure 26:
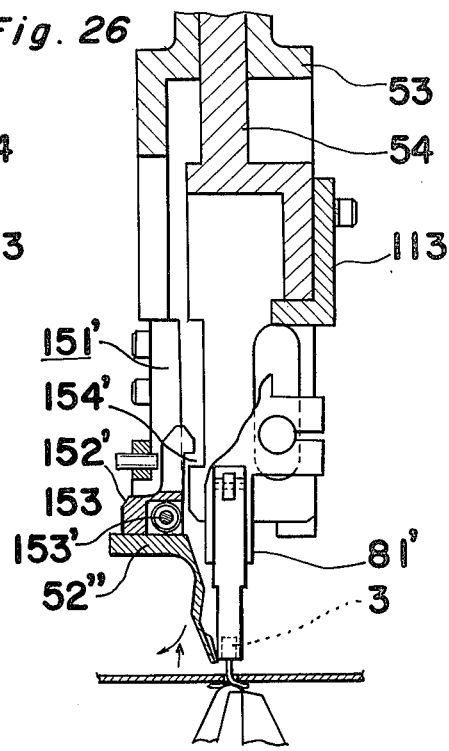
FIG. 26 is a sectional view showing essential portions of the head unit at the bottom dead center.
Figure 27:
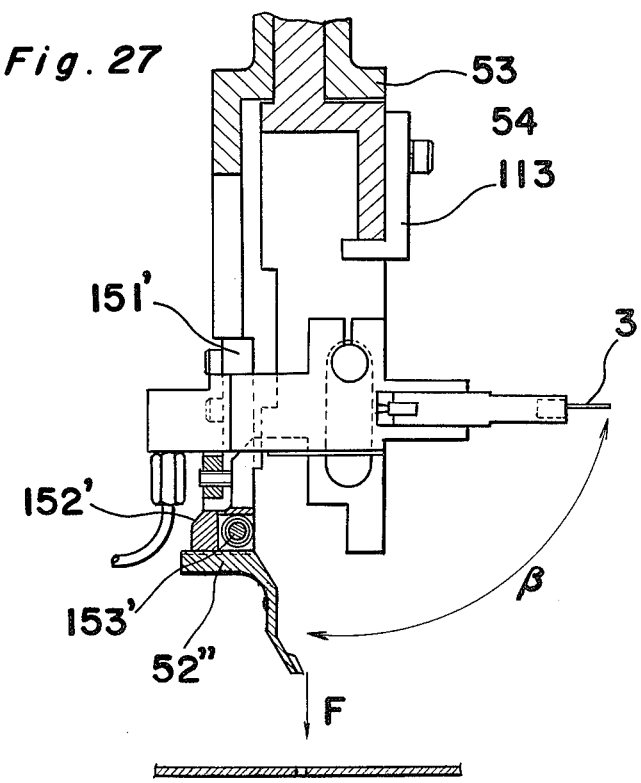
FIG. 27 is a cross-sectional view showing essential portions of the head unit at the top dead center.

Upon descending of the chuck unit body 81, the slide rack 108 is relatively pushed up in accordance with the descending stroke thereof, since the slide rack 108 is normally urged upwardly by an incorporated compression spring (not shown). The pinion 106 engaging the slide rack rotates clockwise thereby rotating the chuck unit body 81 or 81' clockwise, as shown in FIG. 27, resulting in that the lead wires 2a and 2b or 2a', 2b' and 2c of a component are located above the printed circuit board. The rear end of the chuck unit body 81 or 81' is brought into contact with the stopper 113 at a vertical position where the insertion guides 52, 52' or 52" may guide the lead wires to provide preparation for insertion. Upon a further descending operation, the component 3 descends in a vertical condition to guide the lead wires 2a and 2b or 2a', 2b' and 2c of the component to the insertion guides 52, 52' or 52" which guide the lead wires into the printed circuit board holes. When the lead wires 2a and 2b or 2a', 2b' and 2c of the component have been slightly inserted as shown in FIG. 21 or 25 at their top ends into the printed circuit board holes, the guide shaft 53 rises slightly from the top face of the printed circuit board and the electric component body strikes against the inner walls of the insertion guides 52, 52' or 52" located at the lower end of the guide shaft 53 to allow the insertion guides 52, 52' or 52" to escape outside, as shown in FIG. 22 or FIG. 26, with the support point pin 153 or 153' as a support point. An insertion unit having the insertion guides 52 and 52' or 52" also has guide stands 152 or 152' which are inserted into cams such as recesses 154 or 154' formed in the lower end of the insertion shaft 54, thereby opening the insertion guides 52, 52' or 52". The insertion shaft 54 further descends to insert completely the lead wires of the component 3 into the printed circuit board up to the bottom of the body of the component 3, and then shaft 54 ascends. Upon making a setting such that sizes of leg portions of the lead wires are identical with each other so as to establish the same relationship, (a=b) as shown in FIG. 6, a crimped accessory of the lead wires can be inserted into a clearance provided between the printed circuit board top face and the component body.

The driving relationship of the insertion head unit 10 will be described hereinafter.

Figure 28:
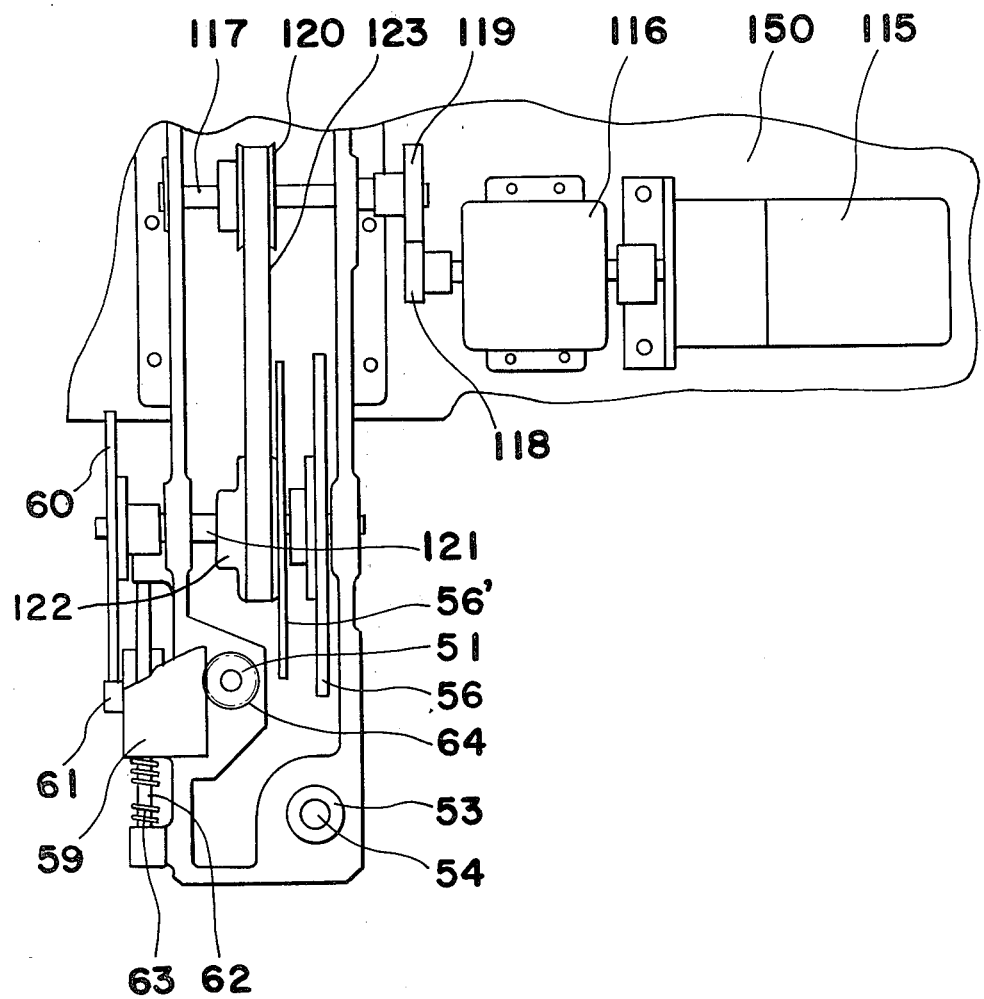
FIG. 28 is a fragmentary diagram explanatory of driving of the insertion head unit.

Referring to FIG. 28, a motor 115 is mounted on the base 150 of the apparatus frame 40. A clutch brake 116 is coupled to the motor 115. A drive shaft 117 is rotatably supported at its ends on the insertion head body 67. A pair of gears 118 and 119 engaged with each other are respectively mounted on the output shaft of the clutch brake 116 and on one end of the drive shaft 117. A timing pulley 120 is mounted on the drive shaft 117. A cam shaft 121 has the two cams 56, 56' and the cam 60 mounted thereon, the cams being adapted to rotate the cutter and oscillate the insertion head, respectively. A timing pulley 122 rotates the cam shaft 121 and a timing belt 123 connects the timing pulley 120 with the timing pulley 122.

The cam shaft 121 is rotated to rotate the cutter unit 47 and to operate the chuck unit body 81 for an insertion operation.

Figure 29:
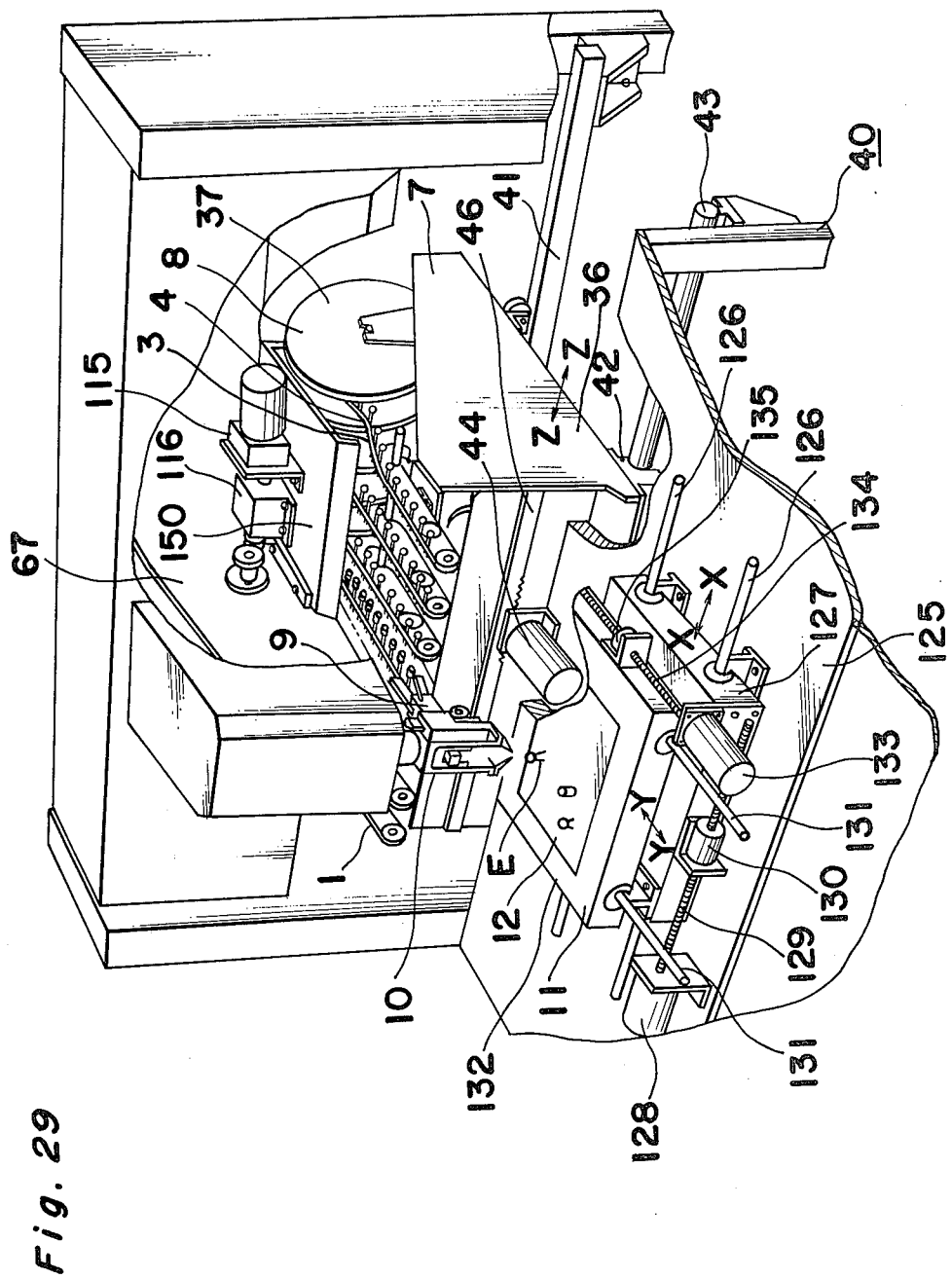
FIG. 29 is a perspective view showing, on an enlarged scale, essential portions of the apparatus of FIG. 5.

The substrate moving unit 11 will be described with reference to FIG. 29. The substrate moving unit 11 is supported on a movable unit platform 125 which is fixed to a forward portion of the apparatus frame 40. A pair of parallel slide shafts 126 disposed in the direction of X in FIG. 29 is secured to the movable unit platform 125. An X frame 127 slides on the parallel slide shafts 126. A pulse motor 128 is mounted on the movable unit platform 125. A ball screw 129 and ball nut 130 are disposed for driving the X frame 127, the ball screw 129 being directly connected with the pulse motor 128 and the ball nut 130 being secured to the X frame 127. A pair of parallel slide shafts 131 are secured onto the X frame, and a Y frame 132 slides on the slide shafts 131. A pulse motor 133 is mounted on the X frame 127. A ball screw 134 and ball nut 135 are disposed for driving the Y frame, the ball screw 134 being directly connected with the pulse motor 133 and the ball nut 135 being secured to the Y frame 132.

Figure 30:
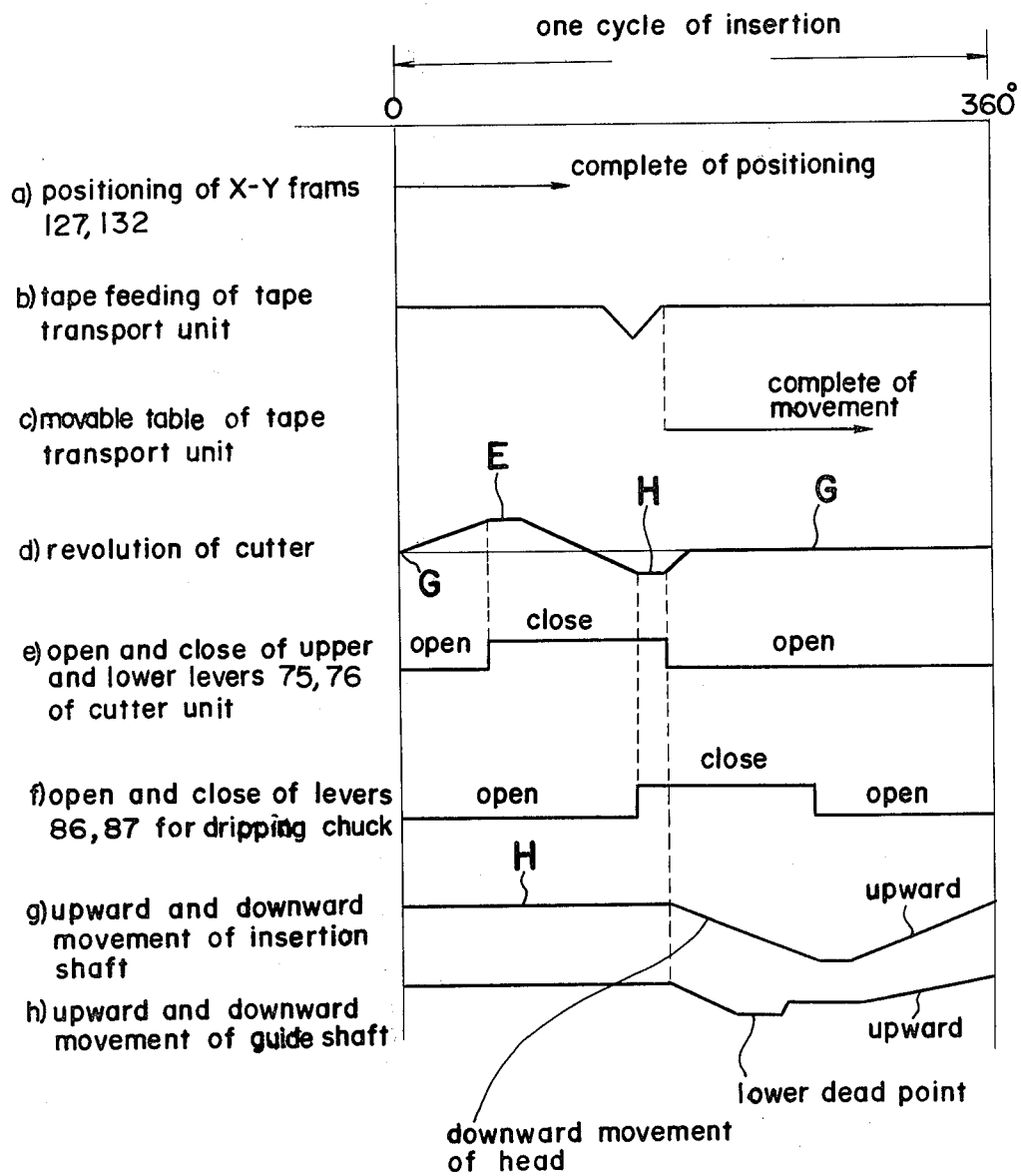
FIG. 30 is a timing chart explanatory of operations of the apparatus of FIG. 5.

Referring now to a timing chart of FIG. 30, the timing chart indicates one insertion cycle for a component to a circuit board in connection with the operation of the component inserting apparatus.

At the start position as shown at O in the chart, the X frame 127 and Y frame 132 are stopped at the previously determined positions of the printed circuit board 12. Also, a component 3 to be inserted is brought into line with the cut-off position E by the tape transport unit 1 and the tape transport unit movable table 7. The cutter unit 47 and the chuck element 48 with the levers open stand-by at the positions G and H respectively. When an insertion signal is received from the drive control unit 13, the X frame 127 and Y frame 132 start to locate the printed circuit board 12 for reception of the next component 3 positioned at the position E to an insertion hole. While the cutter unit immediately moves to the position E, the levers 75 and 76 of the cutter unit 47 of FIG. 9 close to separate the lead wires of the component 3, thereby to transport the component to the position H. Also, when the component 3 is separated from the tape 4 and the cutter unit 47 moves to the position H, the pusher 66 of the cylinder 65 descends to push the lever 22 of the tape transport unit 1 through a roller 23 to transport the tape through the above-described action so that a component may exist normally in the position of line B—B. After the tape transport, the unit movable table 7 starts to move to prepare a component to be inserted. At the position H, the gripping levers 86 and 87 of the chuck unit body 81 or 81' close to open the levers 75 and 76 of the cutter unit 47, thus completing transfer of the component 3. By this time, the positioning operation of the X frame 127 and the Y frame 132 is completed. Thus, the chuck unit body 81 starts to descend to effect the inserting operation for the component.

At this time, the cutter unit 47 is restored to the position G, where the cutter unit stands by until the next inserting operation starts. While the cutter unit 47 stays at the position G or H to G, collision against the tape transport unit 1 is avoided. The chuck unit body 81 or 81' receives the component to insert the component into a corresponding hole in the printed circuit board by the above-described inserting operation. Thus, one cycle of the inserting operation for the component to the board is completed, and the next cycle is repeated in the above same manner.

As clearly understood from the above description, according to the present invention, there is provided a component inserting apparatus comprising a chuck means 48 for gripping the body of a component having a plurality of lead wires extending in the same direction, insertion guides 52 for contacting the outer sides of each of the lead wires to regulate the lead wire in a given position of a printed circuit board, a vertically movable guide shaft 53 for rotatably supporting the insertion guides, an insertion shaft 54 for connecting the chuck means to be movable in the same direction as the guide shaft and to be movable relatively with respect to the guide shaft, the guides providing a follower portion for coming into contact against a cam formed on the insertion shaft to rotate the insertion guides through operative cooperation with the sliding operation of the insertion shaft, thereby separating the insertion guide from the printed circuit board and pivoting the insertion guide in a direction away from the component halfway during a process where the gripped component is inserted into the printed circuit board hole, whereby the electric component can be inserted up to a position, whereat the component body comes into contact against the printed circuit board.

In addition, according to the present invention, a recess is provided in the insertion shaft, the insertion guide becomes integral with the guide block, and the guide block is adapted to be engaged into the recess of the insertion shaft around a pin. Thus, the body of an electric component comes into contact with the insertion guide to spread the insertion guide, thereby inserting the lead wires up to the roots of the lead wires of the electric component. The above construction is extremely advantageous in a case where the existence of a clearance between the printed circuit board and the electric component element is disadvantageous in terms of the circuit property, for example, where the existence of the lead wires on the printed circuit board in a high frequency circuit for an electronic tuner or the like causes trouble such as impedance variation or the like. The entire apparatus of the present invention is simplified in construction, reliable in function and fast in performance, thus resulting in improved reliability, productivity and economy.

Although the present invention has been fully described by way of example with reference to the accompanying drawings, it is to be noted that various changes and modifications are apparent to those skilled in the art. Therefore, unless otherwise such changes and modifications depart from the scope of the present invention they should be construed as included therein.

What is claimed is:

1. A component inserting apparatus for inserting electrical and electronic components into printed circuit boards, said apparatus comprising chuck means for gripping a body portion of a component having a plurality of lead wires extending outwardly therefrom in the same direction, insertion guide means which contacts outer sides of each of the lead wires so as to regulate the lead wires to be positioned at predetermined positions thereby to guide the lead wires into corresponding openings formed in a printed circuit board, a vertically movable guide shaft member for rotatably supporting said insertion guide means, and an insertion shaft member coupled with said chuck means so as to be movable in the same direction as said guide shaft member and also to be movable relatively with respect to said guide shaft member, said insertion guide means being provided with a follower portion contacting a cam formed in said insertion shaft member and rotating said insertion guide means in association with sliding movement of said insertion shaft member for spacing said insertion guide means from the printed circuit board in the course of insertion of the lead wires of the gripped component into the corresponding openings in the printed circuit board and also for rotating said insertion guide means in a direction to be spaced from the component.

2. A component inserting apparatus as claimed in claim 1, wherein said insertion guide means is detachable with respect to said guide shaft member.

* * * * *